(12) United States Patent
Pan et al.

(10) Patent No.: US 8,750,406 B2
(45) Date of Patent: Jun. 10, 2014

(54) MULTI-LEVEL AMPLITUDE SIGNALING RECEIVER

(75) Inventors: Mingde Pan, Morgan Hill, CA (US); Weiqi Ding, Fremont, CA (US); Sergey Shumarayev, Los Altos Hills, CA (US); Peng Li, Palo Alto, CA (US); Masashi Shimanouchi, San Jose, CA (US)

(73) Assignee: Altera Corporation, San Jose, CA (US)

( * ) Notice: Subject to any disclaimer, the term of this patent is extended or adjusted under 35 U.S.C. 154(b) by 186 days.

(21) Appl. No.: 13/363,098

(22) Filed: Jan. 31, 2012

(65) Prior Publication Data

US 2013/0195155 A1 Aug. 1, 2013

(51) Int. Cl.
*H04L 25/34* (2006.01)
*H04L 25/49* (2006.01)

(52) U.S. Cl.
USPC ........... 375/287; 375/286; 375/316; 375/324; 375/340

(58) Field of Classification Search
CPC .. H04l 25/026; H04l 25/4917; H04l 27/2647; H04l 27/00; H04N 5/4401
USPC .......................... 375/287, 316, 286, 324, 340
See application file for complete search history.

(56) References Cited

U.S. PATENT DOCUMENTS

| | | | |
|---|---|---|---|
| 3,534,273 A | 10/1970 | Thomas | |
| 5,761,246 A * | 6/1998 | Cao et al. | 375/287 |
| 5,832,038 A | 11/1998 | Carsello | |
| 6,173,018 B1 | 1/2001 | Kuroki | |
| 6,198,779 B1 | 3/2001 | Taubenheim et al. | |
| 6,324,602 B1 | 11/2001 | Chen et al. | |
| 6,771,675 B1 * | 8/2004 | Cao et al. | 370/537 |
| 7,233,164 B2 | 6/2007 | Stojanovic et al. | |
| 7,795,915 B2 | 9/2010 | Candage et al. | |
| 8,022,726 B2 | 9/2011 | Candage et al. | |
| 8,026,740 B2 | 9/2011 | Hollis | |
| 2004/0071203 A1 * | 4/2004 | Gorecki | 375/229 |
| 2005/0134307 A1 | 6/2005 | Stojanovic et al. | |
| 2008/0246752 A1 | 10/2008 | Lee | |
| 2009/0238300 A1 | 9/2009 | Hollis | |
| 2010/0026261 A1 | 2/2010 | Candage et al. | |
| 2011/0018517 A1 | 1/2011 | Candage et al. | |
| 2011/0311008 A1 | 12/2011 | Slezak et al. | |
| 2011/0316726 A1 | 12/2011 | Hollis | |

FOREIGN PATENT DOCUMENTS

CA 2 296 209 A1 7/2001

OTHER PUBLICATIONS

Extended European Search Report for EP Application No. 13150806.1-1860, Jun. 7, 2013, 6 sheets.

\* cited by examiner

*Primary Examiner* — Ted Wang
(74) *Attorney, Agent, or Firm* — Okamoto & Benedicto LLP

(57) ABSTRACT

One embodiment relates to a receiver circuit for multi-level amplitude signaling which includes at least three amplitude levels for each symbol period. The receiver circuit includes a peak detector, a reference voltage generator, and a comparator circuit. The peak detector is arranged to detect a peak voltage of the multi-level amplitude signal, and the reference voltage generator uses the peak voltage to generate multiple reference voltages. The comparator circuit uses the multiple reference voltages to detect an amplitude level of the multi-level amplitude signal. Other embodiments and features are also disclosed.

12 Claims, 11 Drawing Sheets

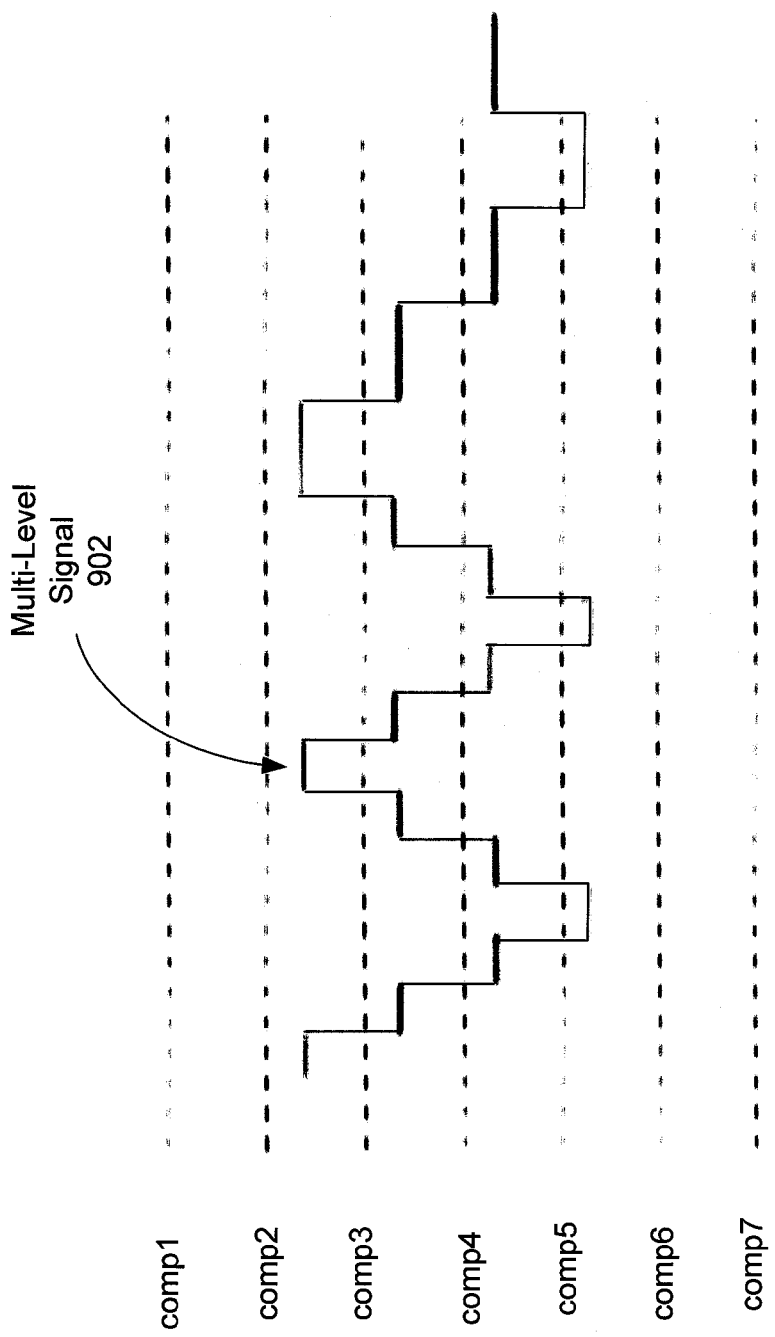
FIG. 9
(Conventional)

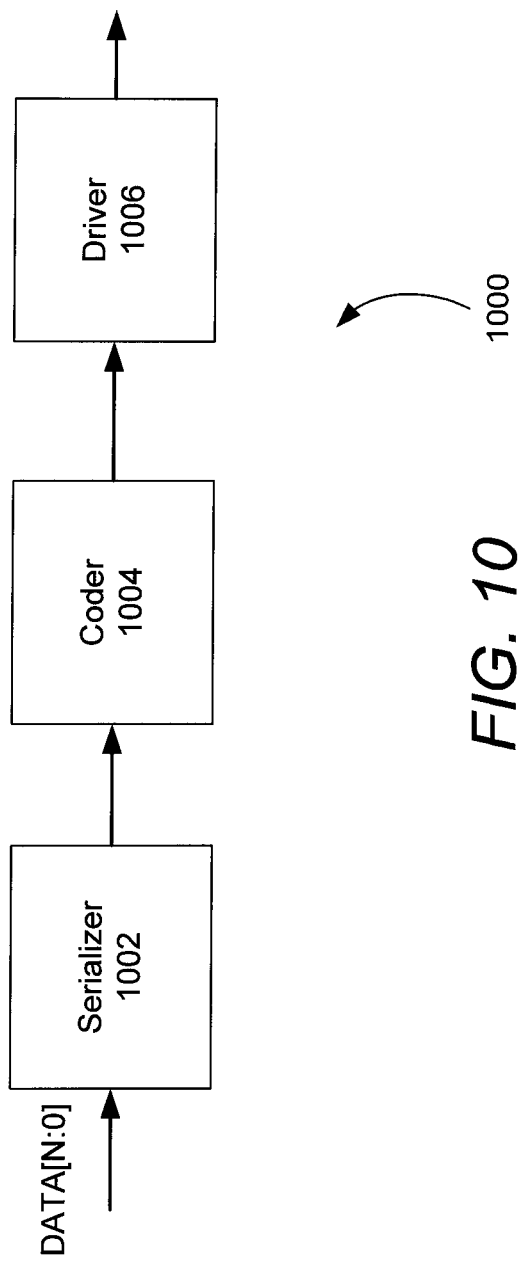

MULTI-LEVEL AMPLITUDE SIGNALING RECEIVER

BACKGROUND

1. Technical Field

The present invention relates generally to data communications. More particularly, the present invention relates to circuitry for high-speed data links.

2. Description of the Background Art

High-speed data links are used to communicate data between devices in a system. Serial interface protocols have been developed at increasingly fast data rates for such high-speed links. Currently, the data signal for most high-speed serial links use just two voltage levels (amplitudes) to convey information: a high level and a low level. The high level may be interpreted as a logical one, and the low level may be interpreted as a logical zero. Such signaling is sometimes referred to as "non-return-to-zero" (NRZ) data signaling. In NRZ signaling, one symbol provides one bit of information within one unit interval (UI).

Instead of using just two levels, multi-level amplitude signaling uses several (at least three) distinct voltage levels. Such multi-level amplitude signaling, which is sometimes referred to as pulse amplitude modulation (PAM) signaling, communicates more than one bit of information per symbol. Hence, for the same symbol rate, PAM signaling provides a higher effective data rate than NRZ signaling.

Unfortunately, transceiver complexity generally increases if, instead of NRZ signaling, PAM signaling is implemented. For example, a high-speed analog-to-digital converter (ADC) circuit is typically implemented at the front end of the receiver to digitize the PAM signal. However, such a high-speed ADC circuit generally requires a relatively large area to implement and typically consumes a large amount of power.

SUMMARY

One embodiment relates to a receiver circuit for multi-level amplitude signaling which includes at least three amplitude levels for each symbol period. The receiver circuit includes a peak detector, a reference voltage generator, and a comparator circuit. The peak detector is arranged to detect a peak voltage of the multi-level amplitude signal, and the reference voltage generator uses the peak voltage to generate multiple reference voltages. The comparator circuit uses the multiple reference voltages to detect an amplitude level of the multi-level amplitude signal.

Another embodiment relates to a method of receiving a multi-level amplitude signal which includes at least three amplitude levels for each symbol period. A peak voltage of the multi-level amplitude signal is detected, and multiple reference voltages which depend on the peak voltage are generated. The multi-level amplitude signal is compared against the plurality of reference voltages to detect an amplitude level.

Another embodiment relates to an integrated circuit which includes a pulse amplitude modulation receiver. The receiver includes at least a peak detector, a reference voltage generator, and a comparator circuit. The peak detector is arranged to detect a peak voltage of a transmitted pulse amplitude modulation signal which includes at least three amplitude levels for each symbol period. The reference voltage generator is arranged to generate a plurality of reference voltages which depend on the peak voltage. The comparator circuit is arranged to compare the pulse amplitude modulation signal against the plurality of reference voltages to detect an amplitude level.

Other embodiments and features are also disclosed.

BRIEF DESCRIPTION OF THE DRAWINGS

FIG. 9 shows an example PAM-4 signal and seven reference levels that may be used by a conventional receiver circuit.

FIG. 10 is a block diagram of a multi-level amplitude signaling transmitter in accordance with an embodiment of the invention.

DETAILED DESCRIPTION

The present disclosure provides an innovative receiver architecture for PAM signaling that substantially reduces the receiver complexity. In accordance with an embodiment of the invention, the receiver architecture automatically aligns a number of slicing voltage levels to minimize the number of required samplers.

Figure 1:
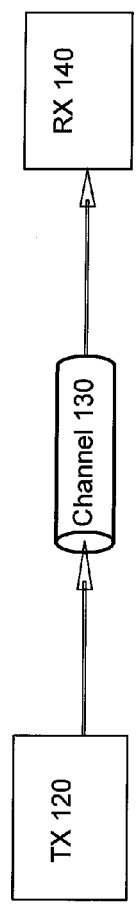
FIG. 1 is a high-level diagram of a communication link in accordance with an embodiment of the invention.

FIG. 1 is a high-level diagram of a communication link 100 in accordance with an embodiment of the invention. As shown in FIG. 1, a communication link 100 is generally composed of a transmitter (TX) 120, a receiver (RX) 140, and a communication channel 130 that is used to communicate signals between the transmitter and the receiver. The channel 130 may include one or more lanes.

As relevant to the present disclosure, the communication link 100 may utilize multi-level signaling to increase the effective data rate of the link 100. Such multi-level signaling uses three or more voltage levels to communicate information.

In PAM signaling, information is encoded in the amplitude of a series of signal pulses. PAM-M signaling refers to PAM signaling where the amplitude of each signal pulse may be at one of M voltage levels. For example, in PAM-3 signaling, the amplitude of each signal pulse may be at one of three voltage levels, such as, for instance: −3 volts; 0 volts; or +3 volts. As another example, in PAM-4 signaling, the amplitude of each signal pulse may be at one of four voltage levels, such as, for instance: −3 volts; −1 volt; +1 volt; or +3 volts. NRZ signaling is essentially PAM-2 signaling. Note that, while embodiments involving PAM-3 and PAM-4 signaling are described in detail below, the receiver architecture disclosed herein may be applied in general to PAM-M signaling, where M is three or more.

Figure 2:
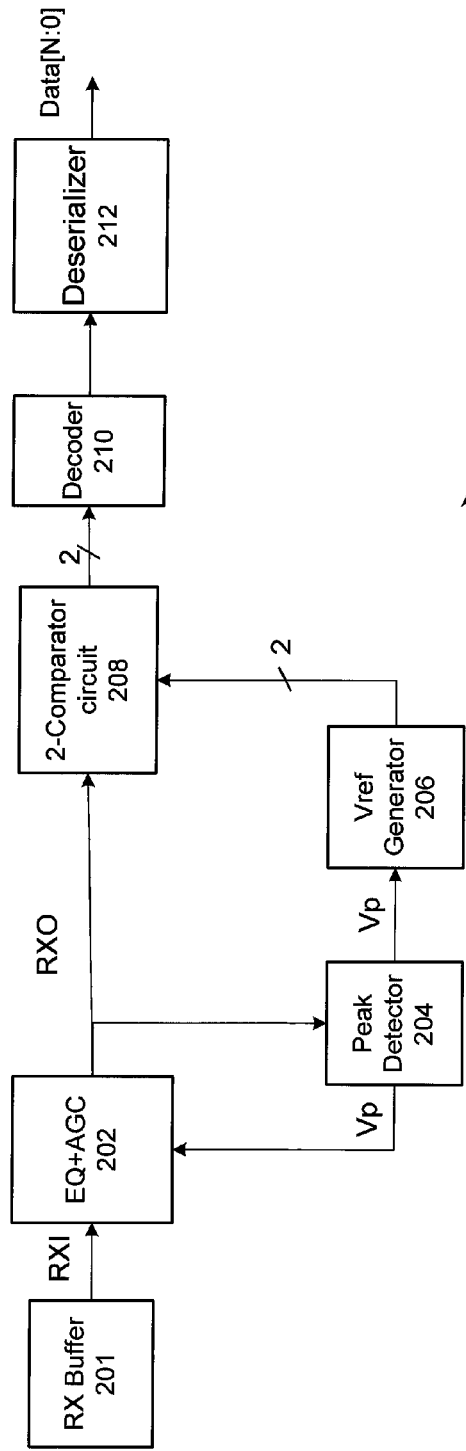
FIG. 2 is a block diagram depicting a PAM-3 signaling receiver in accordance with an embodiment of the invention.

FIG. 2 is a block diagram depicting a PAM-3 signaling receiver 200 in accordance with an embodiment of the invention. As shown, the receiver 200 may include a receiver buffer (RX Buffer) 201, an equalizer and automatic gain control (EQ+AGC) circuit 202, a peak detector 204, a voltage reference generator (Vref generator) 206, a 2-comparator circuit 208, a decoder 210, and a deserializer 212.

The RX Buffer 201 may be arranged to receive a PAM-3 signal which has been transmitted over a communication channel 130 and to output a buffered PAM-3 signal (RXI). The RXI signal may be input into the EQ+AGC circuit 202. After equalizing and adjusting the gain of the signal, the EQ+AGC circuit 202 may output an equalized and gain-adjusted PAM-3 signal (the RXO signal).

The RXO signal may be input to both the peak detector 204 and the 2-Comparator circuit 208. The peak detector 204 may be arranged to output a peak voltage (Vp) signal which corresponds to a peak voltage of the RXO signal. The peak detector 204 may be implemented, for example, using on-chip signal quality monitoring circuitry which may be referred to as EYE Monitor circuitry. As shown, the Vp signal may be output to both the Vref generator 206 and the EQ+AGC circuit 202. The EQ+AGC circuit 202 may use the Vp signal in its adjustment of the signal gain.

The Vref generator 206 may be arranged to utilize the Vp signal to generate multiple reference voltage levels. In this case, two reference voltage levels may be generated by the Vref generator 206. One embodiment of the Vref generator 206 is described below in relation to FIG. 3.

The 2-comparator circuit 208 may be arranged to use the reference voltage levels from the Vref generator 206 as slicing levels for the PAM-3 signal. A two-bit signal that indicates the comparison results may be output from the 2-comparator circuit 208. One embodiment of the 2-comparator circuit 208 is described below in relation to FIG. 4.

The 2-bit signal from the 2-comparator circuit 208 may be received by the decoder 210. The decoder 210 may be arranged to decode the 2-bit signal so as to re-generate the serial binary data signal from the transmitter. The serial binary data signal may be received by the deserializer 212. The deserializer 212 may be arranged to convert the serial binary data signal to parallel binary data signals (shown as Data[N:0]).

In contrast to a conventional PAM signaling receiver, the receiver 200 in FIG. 2 does not include an ADC circuit at the front end. Instead, two slicing voltage levels are automatically generated using the peak detector 204 and the Vref generator 206, and the 2-comparator circuit 208 and the decoder 210 are used to demodulate and decode the signal.

Figure 3:
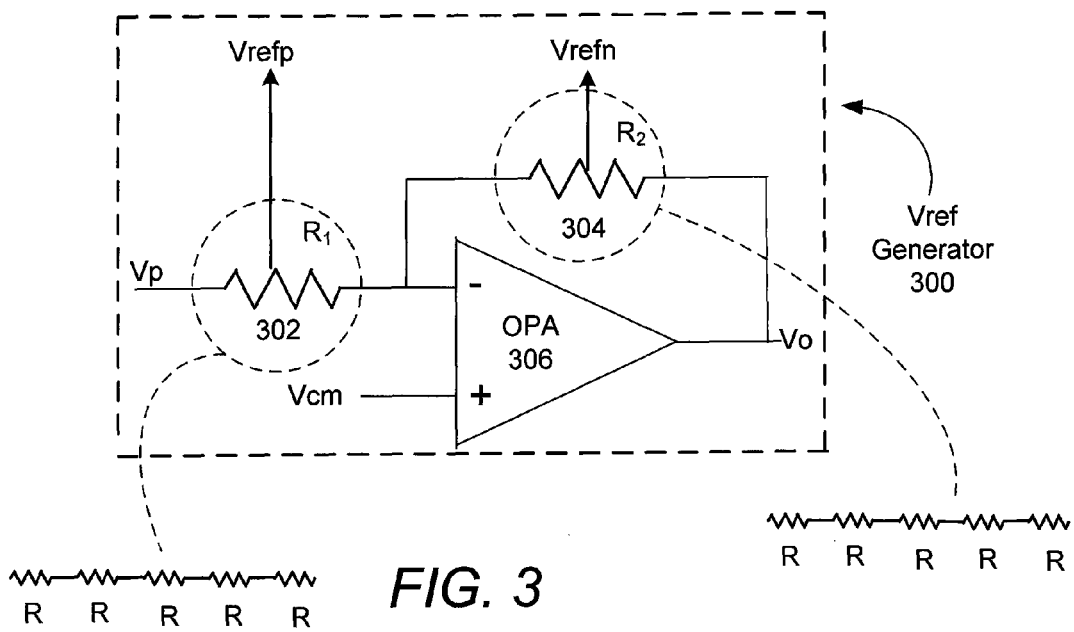
FIG. 3 depicts reference voltage generator circuit which may be used by a receiver in accordance with an embodiment of the invention.

FIG. 3 depicts a reference voltage generator circuit (Vref generator) 300 which may be used by a receiver in accordance with an embodiment of the invention. The Vref generator 300 in FIG. 3 may be used as the Vref Generator 206 for the receiver 200 in FIG. 2. As shown in FIG. 3, the Vref generator 300 may include an inverting amplifier circuit which is formed using a first resistor ladder 302 having an end-to-end resistance $R_1$, a second resistor ladder 304 having an end-to-end resistance $R_2$, and an operational amplifier (OPA) circuit 306.

The first resistor ladder 302 may be arranged between a peak voltage Vp input and the negative input terminal of the OPA 306. The second resistor ladder 304 may be arranged between the negative input terminal and the output terminal of the OPA 306. The positive input terminal of the OPA 306 may be connected to a common mode voltage Vcm. The output terminal of the OPA 306 may provide an output voltage signal $Vo=-(R_2/R_1)Vp+Vcm(R_1+R_2)/R_1$. If Vcm is zero volts (ground) and $R_1=R_2$, then $Vo=-Vp$.

The first resistor ladder 302 may include multiple resistor elements R in series, and a first (positive) reference voltage (Vrefp) may be obtained from a node between two adjacent resistor elements R in the ladder. The node in the ladder which outputs Vrefp may be programmably selected during configuration of the receiver. In this case, due to the negative terminal of the OPA 306 being effectively driven to Vcm, the voltage level for Vrefp may be programmably selected to be a voltage level in a range between Vp and Vcm.

Similarly, the second resistor ladder 304 may also include multiple resistor elements R in series, and a second (negative) reference voltage (Vrefn) may be obtained from a node between two adjacent resistor elements R in the ladder. The node in the ladder which outputs Vrefn may be programmably selected during configuration of the receiver. In this case, due to the negative terminal of the OPA 306 being effectively driven to Vcm, the voltage level for Vrefn may be programmably selected to be a voltage level in a range between Vcm and Vo.

While the example resistor ladders shown in FIG. 3 each have five resistor elements, the number of resistor elements may be any number. For example, a larger number of resistor elements may be included in a resistor ladder to increase the granularity at which a reference voltage may be programmably selected. Furthermore, the resistance of the resistor elements R in a ladder may be the same, or may vary, depending on the implementation.

Figure 4:
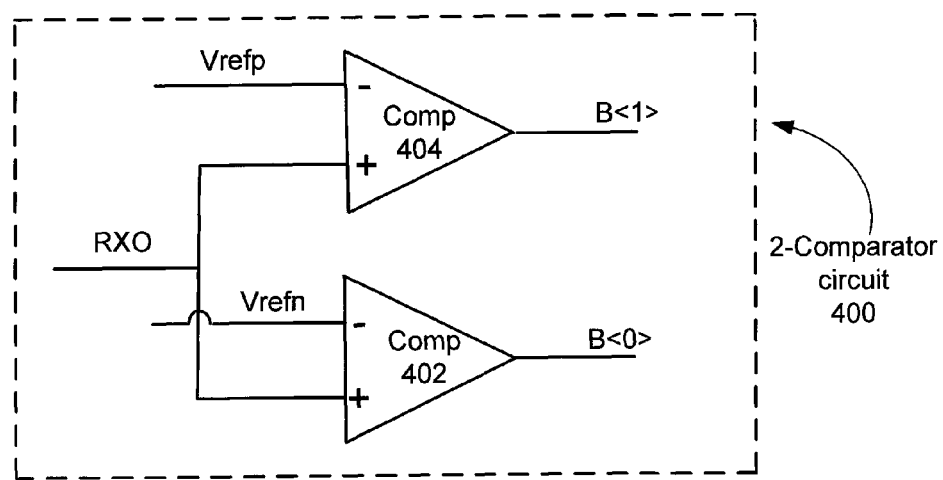
FIG. 4 depicts a 2-comparator circuit which may be used by a three-level signaling receiver in accordance with an embodiment of the invention.

FIG. 4 depicts a 2-comparator circuit 400 which may be used by a three-level signaling receiver in accordance with an embodiment of the invention. The 2-comparator circuit 400 in FIG. 4 may be used as the 2-comparator circuit 208 for the receiver 200 in FIG. 2.

A first comparator 402 may be arranged to compare each symbol in the RXO signal (the equalized and gain-adjusted PAM-3 signal from the EQ+ADC circuit 202) against the Vrefn signal (the negative reference voltage from the Vref generator 206). The output of the first comparator 402 may be a first code bit signal B<0> which depends on the result of the comparison. For example, B<0> may be high (logical one) if RXO is higher than Vrefn at the time of the comparison and may be low (logical zero) if RXO is lower than Vrefn at the time of the comparison.

A second comparator 404 may be arranged to compare each symbol in the RXO signal against the Vrefp signal (the positive reference voltage from the Vref generator 206). The output of the second comparator 404 may be a second code bit signal B<1> which depends on the result of the comparison. For example, B<1> may be high (logical one) if RXO is higher than Vrefp at the time of the comparison and may be low (logical zero) if RXO is lower than Vrefp at the time of the comparison.

The two-bit code signal (including B<0> and B<1>) indicates an amplitude level for each symbol in the PAM-3 signal. For example, if B<0> and B<1> are both low, then the amplitude may be indicated to be at a low level. If B<0> and B<1> are both high, then the amplitude may be indicated to be at a high level. Finally, if B<0> is high and B<1> is low, then the amplitude may be indicated to be at a middle level.

Figure 5:
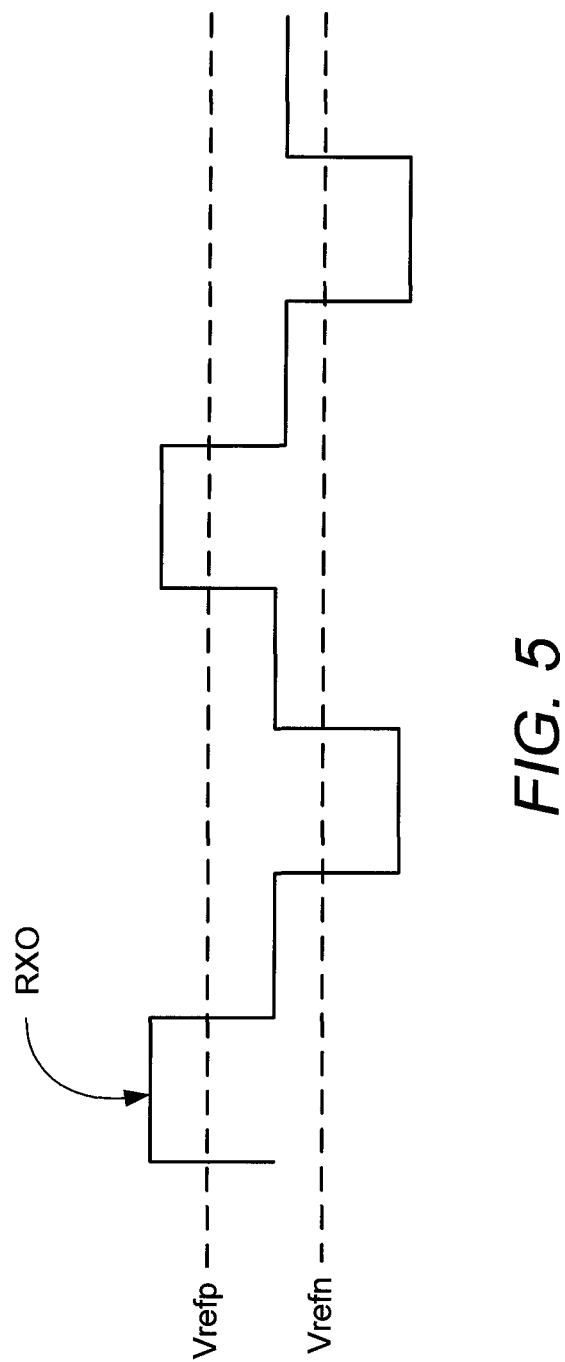
FIG. 5 shows an example PAM-3 signal and two reference levels that may be generated and used by a receiver circuit in accordance with an embodiment of the invention.

FIG. 5 shows an example PAM-3 signal (RXO) and two reference levels (Vrefn and Vrefp) that may be generated and used by a receiver circuit in accordance with an embodiment of the invention. As seen, the RXO signal may transition between three amplitude levels: a low level below Vrefn; a high level above Vrefp; and a middle level between Vrefn and Vrefp.

Figure 6:
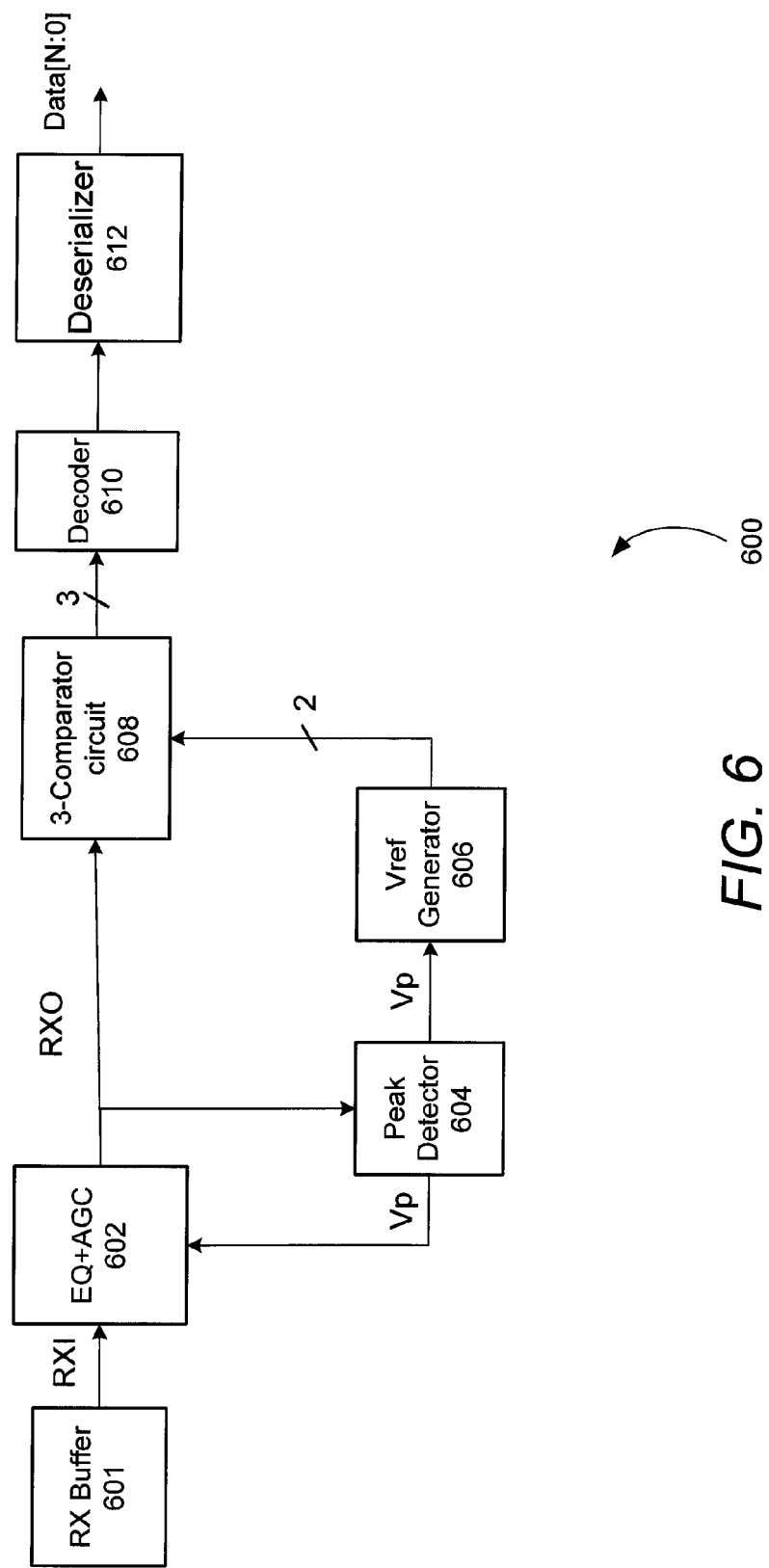
FIG. 6 is a block diagram depicting a PAM-4 signaling receiver in accordance with an embodiment of the invention.

FIG. 6 is a block diagram depicting a PAM-4 signaling receiver in accordance with an embodiment of the invention. As shown, the receiver 600 may include a receiver buffer (RX Buffer) 601, an equalizer and automatic gain control (EQ+AGC) circuit 602, a peak detector 604, a voltage reference generator (Vref generator) 606, a 3-comparator circuit 608, a decoder 610, and a deserializer 612.

The RX Buffer 601 may be arranged to receive a PAM-4 signal which has been transmitted over a communication channel 130 and to output a buffered PAM-4 signal (RXI). The RXI signal may be input into the EQ+AGC circuit 602. After equalizing and adjusting the gain of the signal, the EQ+AGC circuit 602 may output an equalized and gain-adjusted PAM-4 signal (the RXO signal).

The RXO signal may be input to both the peak detector 604 and the 3-Comparator circuit 608. The peak detector 604 may be arranged to output a peak voltage (Vp) signal which corresponds to a peak voltage of the RXO signal. The peak detector 604 may be implemented, for example, using EYE Monitor circuitry. As shown, the Vp signal may be output to both the Vref generator 606 and the EQ+AGC circuit 602. The EQ+AGC circuit 602 may use the Vp signal in its adjustment of the signal gain.

The Vref generator 606 may be arranged to utilize the Vp signal to generate multiple reference voltage levels. In this case, two reference voltage levels may be generated by the Vref generator 606. One embodiment of the Vref generator 606 is described above in relation to FIG. 3.

The 3-comparator circuit 608 may be arranged to use the two reference voltage levels from the Vref generator 606 and the common mode voltage level (Vcm) as slicing levels for the PAM-4 signal. A three-bit signal that indicates the comparison results may be output from the 3-comparator circuit 608. One embodiment of the 3-comparator circuit 608 is described below in relation to FIG. 7.

The 3-bit signal from the 3-comparator circuit 608 may be received by the decoder 610. The decoder 610 may be arranged to decode the 3-bit signal so as to re-generate the serial binary data signal from the transmitter. The serial binary data signal may be received by the deserializer 612. The deserializer 612 may be arranged to convert the serial binary data signal to parallel binary data signals (shown as Data[N:0]).

In contrast to a conventional PAM signaling receiver, the receiver 600 in FIG. 6 does not include an ADC circuit at the front end. Instead, three slicing voltage levels are automatically generated using the peak detector 604 and the Vref generator 606, and the 3-comparator circuit 608 and the decoder 610 are used to demodulate and decode the signal.

Figure 7:
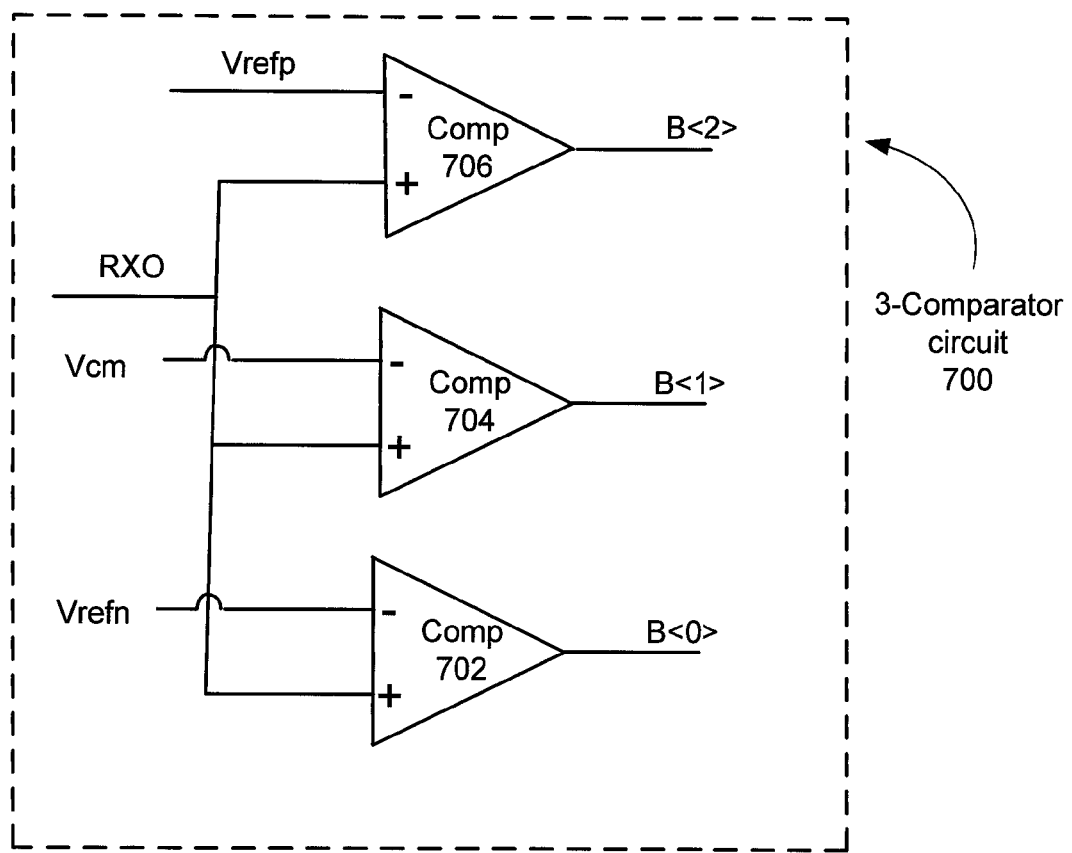
FIG. 7 depicts a three-comparator circuit may be used by a PAM-4 signaling receiver in accordance with an embodiment of the invention.

FIG. 7 depicts a 3-comparator circuit 700 which may be used by a PAM-4 receiver in accordance with an embodiment of the invention. The 3-comparator circuit 700 in FIG. 7 may be used as the 3-comparator circuit 608 for the receiver 600 in FIG. 6.

A first comparator 702 may be arranged to compare each symbol in the RXO signal (the equalized and gain-adjusted PAM-4 signal from the EQ+ADC circuit 602) against the Vrefn signal (the negative reference voltage from the Vref generator 606). The output of the first comparator 702 may be a first code bit signal B<0> which depends on the result of the comparison. For example, B<0> may be high (logical one) if RXO is higher than Vrefn at the time of the comparison and may be low (logical zero) if RXO is lower than Vrefn at the time of the comparison.

A second comparator 704 may be arranged to compare each symbol in the RXO signal against the Vcm signal (the common mode voltage). The output of the second comparator 704 may be a second code bit signal B<1> which depends on the result of the comparison. For example, B<1> may be high (logical one) if RXO is higher than Vcm at the time of the comparison and may be low (logical zero) if RXO is lower than Vcm at the time of the comparison.

A third comparator 706 may be arranged to compare each symbol in the RXO signal against the Vrefp signal (the positive reference voltage from the Vref generator 606). The output of the third comparator 704 may be a third code bit signal B<2> which depends on the result of the comparison. For example, B<2> may be high (logical one) if RXO is higher than Vrefp at the time of the comparison and may be low (logical zero) if RXO is lower than Vrefp at the time of the comparison.

The three-bit code signal (including B<0>, B<1>, and B<2>) indicates an amplitude level for each symbol in the PAM-4 signal. For example, if B<0> is low, then the amplitude may be indicated to be at a lowest level, while if B<2> is high, then the amplitude may be indicated to be at a highest level. Else, if B<0> is high and B<2> is low, then the amplitude may be indicated to be at a second lowest level if B<1> is low and may be indicated to be at a second highest level if B<1> is high.

Figure 8:
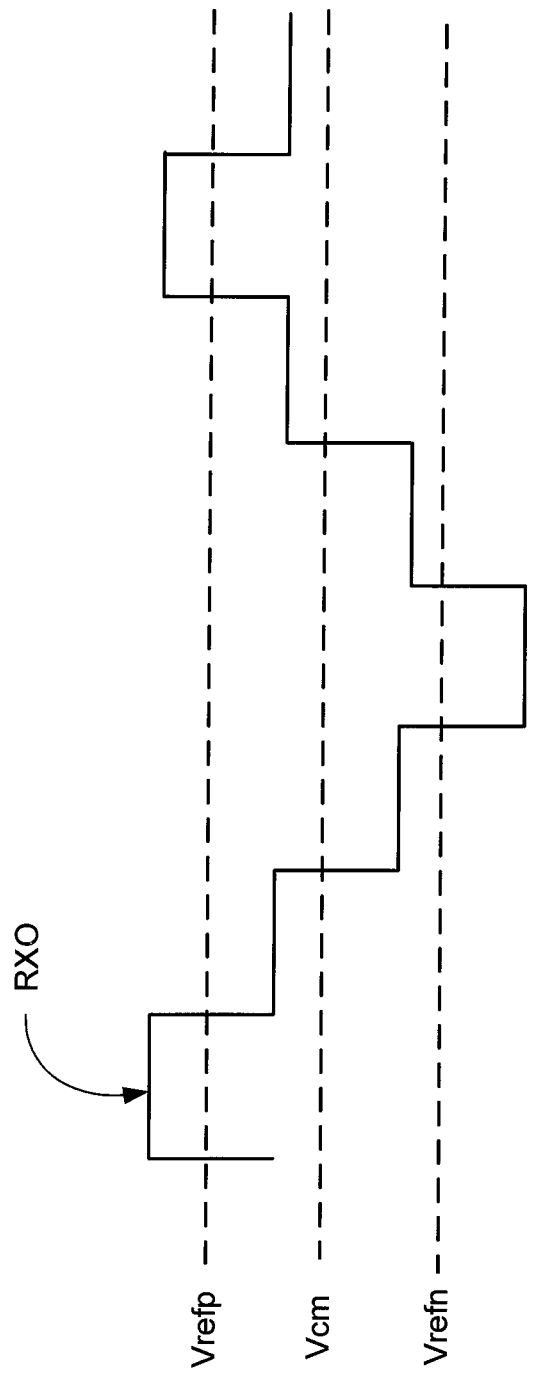
FIG. 8 shows an example PAM-4 signal and three reference levels that may be generated and used by a receiver circuit in accordance with an embodiment of the invention.

FIG. 8 shows an example PAM-4 signal and three reference levels that may be generated and used by a receiver circuit in accordance with an embodiment of the invention. As seen, the RXO signal may transition between four amplitude levels: a lowest level below Vrefn; a second lowest level above Vrefn and below Vcm; a second highest level above Vcm and below Vrefp; and a highest level above Vrefp. Advantageously, the automatic alignment of the reference levels to slice the PAM-4 signal allows for a minimal number of comparators to be used.

In contrast, FIG. 9 shows an example PAM-4 signal and seven reference levels (comp1 through comp7) that may be used by a conventional receiver circuit. For a conventional receiver, the reference levels are not automatically aligned to slice the PAM-4 signal. As such, a greater number of comparators are needed to ensure that the reference levels can accurately distinguish between the different levels of the PAM-4 signal.

Figures 11A, 11B:
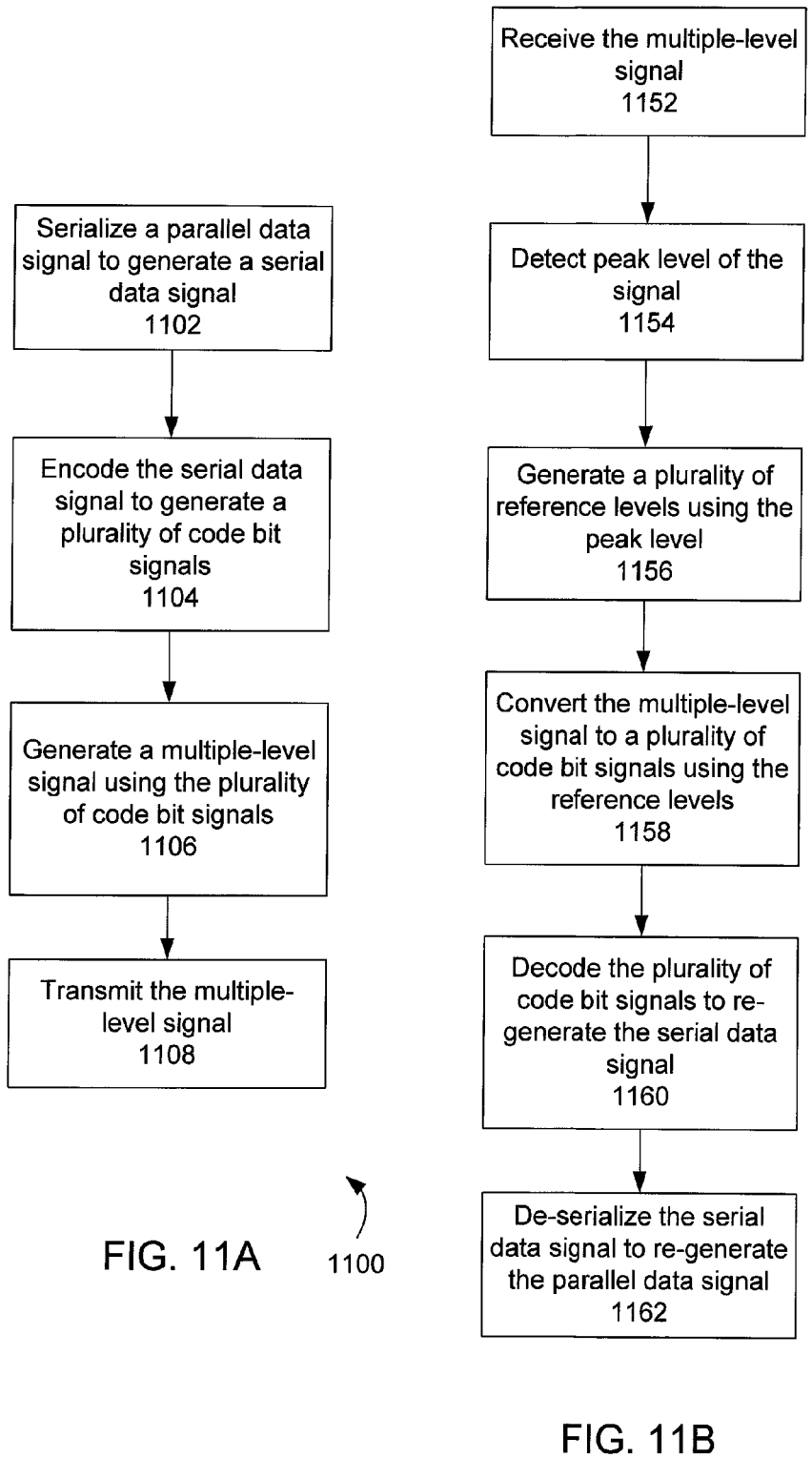
FIG. 11A is a flow chart of a method of transmitting a multi-level amplitude signal in accordance with an embodiment of the invention.
FIG. 11B is a flow chart of a method of receiving a multi-level amplitude signal in accordance with an embodiment of the invention.

In accordance with an embodiment of the invention, FIG. 10 is a block diagram of a multi-level amplitude signaling transmitter 1000, while FIG. 11A shows a flow chart of a method of transmitting a multi-level amplitude signal. As shown in FIG. 10, the transmitter 1000 may include a serializer 1002, a coder 1004, and a driver 1006. The serializer 1002 receives parallel data signals (DATA[N:0]) to be transmitted over a communication channel 130 to a receiver 140. The serializer 1002 serializes 1102 the parallel data signal to generate a serial data signal which is output to the coder 1004. The coder 1004 may be arranged to encode 1104 the serial data signal so as to generate a plurality of code bit signals. The driver 1006 may be arranged to generate 1106 a multi-level amplitude signal based on the code bit signals and transmit 1108 the multi-level amplitude signal via the communication channel 130 to the receiver 140.

A method of receiving 1150 a multi-level amplitude signal is shown in FIG. 11B in accordance with an embodiment of the invention. As shown, the mutli-level amplitude signal may be received, and a peak level of the signal may be detected 1154. Using the peak level of the multi-level amplitude signal, a plurality of reference levels may be generated 1156.

In accordance with an embodiment of the invention, the reference levels may be generated 1156 in a manner such that they are automatically aligned. The alignment is such that the multi-level amplitude signal may be sliced in a robust way into distinct levels. The alignment may be achieved automatically by the detection of the peak voltage and by using a reference voltage generator which has been previously programmed to generate slicing voltages that are appropriate for the particular multi-level amplitude signal being received.

The multi-level amplitude signal may then be converted 1158 to a plurality of code bit signals using the reference levels, and the plurality of code bit signals may be decoded 1160 to generate the serial data signal. Finally, the serial data signal may be de-serialized 1162 to re-generate the parallel data signal which was transmitted.

Figure 12:
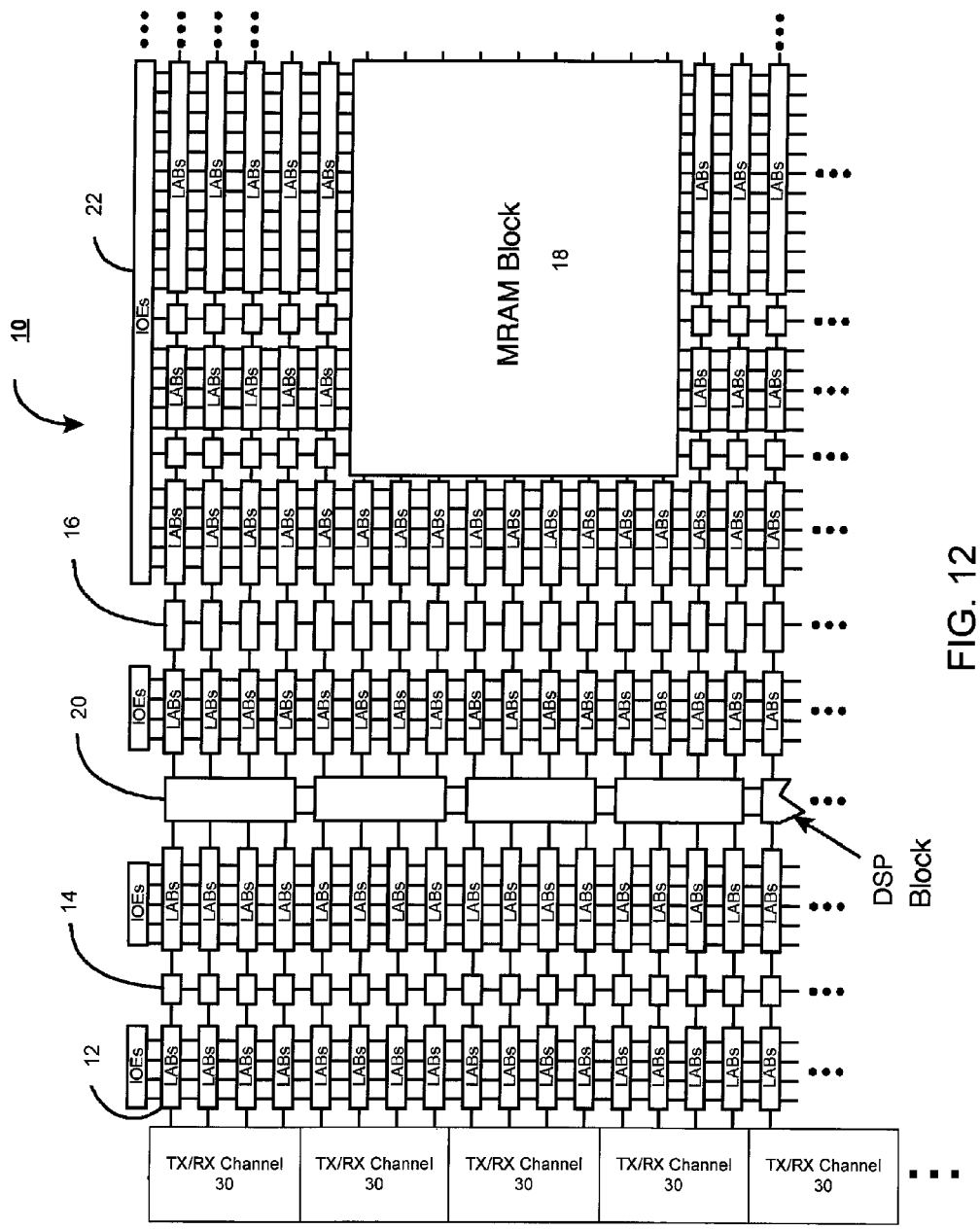
FIG. 12 is a simplified partial block diagram of a field programmable gate array that may be arranged or configured to include one or more of the circuits disclosed herein in accordance with an embodiment of the invention.

FIG. 12 is a simplified partial block diagram of a field programmable gate array (FPGA) 10 that may be arranged or configured to include one or more of the circuits disclosed herein in accordance with an embodiment of the invention. It should be understood that embodiments of the present invention may be used in numerous types of integrated circuits, including FPGAs, programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers. FPGA 10 may further include digital signal processing (DSP) blocks 20 that can implement, for example, multipliers with add or subtract features.

Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, the receiver circuitry described herein.

It is to be understood that FPGA 10 is described herein for illustrative purposes only and that the present invention can be implemented in many different types of PLDs, FPGAs, and ASICs.

Figure 13:
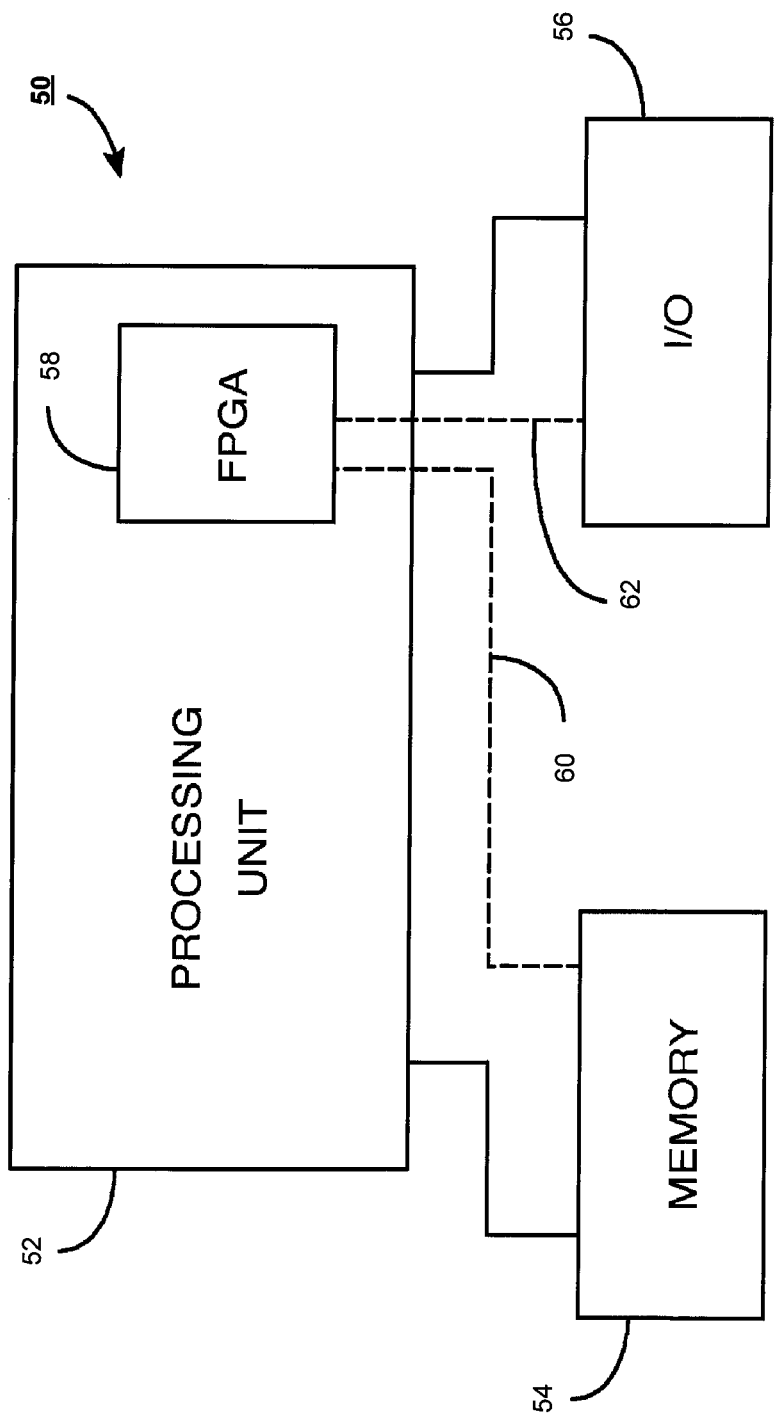
FIG. 13 is a block diagram of an exemplary digital system that may employ a multi-level signaling data link in accordance with an embodiment of the invention.

FIG. 13 is a block diagram of an exemplary digital system 50 that may employ multi-level amplitude signaling in accordance with an embodiment of the invention. As shown, system 50 may include an FPGA as one of several components.

System 50 may be, for example, a programmed digital computer system, digital signal processing system, specialized digital switching network, or other processing system. System 50 may be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

As shown, system 50 includes a processing unit 52, a memory unit 54, and an input/output (I/O) unit 56 interconnected together by one or more buses. According to this exemplary embodiment, FPGA 58 is embedded in processing unit 52. FPGA 58 may serve many different purposes within the system 50. FPGA 58 may, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A receiver circuit for multi-level amplitude signaling, the receiver circuit comprising:
    a peak detector for detecting a peak voltage of a multi-level amplitude signal which includes at least three amplitude levels for each symbol period;
    a reference voltage generator for generating a plurality of reference voltages at least partially in response to the peak voltage; and
    a comparator circuit which uses the plurality of reference voltages to detect an amplitude level of the multi-level amplitude signal,
    wherein a number of comparators in the comparator circuit is less than a number of amplitude levels in the multi-level amplitude signal.

2. The receiver circuit of claim 1, wherein the multi-level amplitude signal comprises a three-level pulse amplitude modulated (PAM-3) signal, and wherein the comparator circuit comprises less than three comparators.

3. The receiver circuit of claim 1, wherein the multi-level amplitude signal comprises a four-level pulse amplitude modulated (PAM-4) signal, and wherein the comparator circuit comprises less than four comparators.

4. A receiver circuit for multi-level amplitude signaling, the receiver circuit comprising:
    a peak detector for detecting a peak voltage of a multi-level amplitude signal which includes at least three amplitude levels for each symbol period;
    a reference voltage generator for generating a plurality of reference voltages at least partially in response to the peak voltage; and
    a comparator circuit which uses the plurality of reference voltages to detect an amplitude level of the multi-level amplitude signal,
    wherein the reference voltage generator comprises an inverting amplifier that includes at least one resistor ladder.

5. The receiver circuit of claim 4, wherein a reference voltage is obtained from a node in the resistor ladder.

6. The receiver circuit of claim 5, wherein selection of the node is programmable.

7. A method of receiving a multi-level amplitude signal, the method comprising:
    detecting a peak voltage of a multi-level amplitude signal by a peak detector circuit, wherein the multiple-level amplitude signal includes at least three amplitude levels for each symbol period;
    generating a plurality of reference voltages by a reference voltage generator circuit, wherein the plurality of reference voltages are at least partially responsive to the peak voltage; and
    comparing the multi-level amplitude signal against the plurality of reference voltages by a comparator circuit to detect an amplitude level,
    wherein the comparing is performed by a number of comparators that is less than a number of amplitude levels in the multi-level amplitude signal.

8. The method of claim 7, wherein the multi-level amplitude signal comprises a three-level pulse amplitude modulated (PAM-3) signal, and wherein the comparator comparing is performed by less than three comparators.

9. The method of claim 7, wherein the multi-level amplitude signal comprises a four-level pulse amplitude modulated (PAM-4) signal, and wherein the comparing is performed by less than four comparators.

10. A method of receiving a multi-level amplitude signal, the method comprising:
    detecting a peak voltage of a multi-level amplitude signal by a peak detector circuit, wherein the multiple-level amplitude signal includes at least three amplitude levels for each symbol period;
    generating a plurality of reference voltages by a reference voltage generator circuit, wherein the plurality of reference voltages are at least partially responsive to the peak voltage; and
    comparing the multi-level amplitude signal against the plurality of reference voltages by a comparator circuit to detect an amplitude level,
    wherein the plurality of reference voltages are generated using an inverting amplifier that includes at least one resistor ladder.

11. The method of claim 10, further comprising:
    obtaining a reference voltage from a node in the resistor ladder.

12. An integrated circuit comprising:
    a pulse amplitude modulation receiver which includes
        a peak detector arranged to detect a peak voltage of a transmitted pulse amplitude modulation signal which includes at least three amplitude levels for each symbol period,
        a reference voltage generator arranged to generate a plurality of reference voltages which depend on the peak voltage, and
        a comparator circuit arranged to compare the pulse amplitude modulation signal against the plurality of reference voltages to detect an amplitude level; and
    a transmitter which includes
        a serializer arranged to convert a parallel data signal to a serial data signal,
        a coder arranged to encode the serial data signal so as to generate a plurality of code bits, and
        a driver arranged to use the plurality of code bits to generate a pulse amplitude modulation signal for transmission.

* * * * *